United States Patent [19]
Chou et al.

[11] Patent Number: 5,272,099
[45] Date of Patent: Dec. 21, 1993

[54] FABRICATION OF TRANSISTOR CONTACTS

[75] Inventors: Hsiang-Ming J. Chou; Hu H. Chao, both of Hsinchu, Taiwan

[73] Assignees: Etron Technology Inc.; Industrial Technology Research Institute, both of Hsinchu, Taiwan

[21] Appl. No.: 982,598

[22] Filed: Nov. 27, 1992

[51] Int. Cl.[5] .................. H01L 21/283; H01L 21/225; H01L 21/336
[52] U.S. Cl. ..................... 437/41; 437/162; 437/191; 437/193
[58] Field of Search .................. 437/193, 40, 41, 191, 437/162, 44; 257/756, 754

[56] References Cited

U.S. PATENT DOCUMENTS

| | | | |
|---|---|---|---|
| 4,516,147 | 5/1985 | Komatsu et al. | 257/756 |
| 4,808,555 | 2/1989 | Mauntel et al. | 437/191 |
| 4,901,134 | 2/1990 | Misawa et al. | 257/754 |
| 4,966,864 | 10/1990 | Pfierter | 437/191 |
| 5,030,584 | 7/1991 | Nakata | 437/44 |
| 5,049,514 | 9/1991 | Mozi | 437/41 |
| 5,168,072 | 12/1992 | Moslehi | 437/41 |

FOREIGN PATENT DOCUMENTS 2062959A  5/1981  United Kingdom .............. 437/193

*Primary Examiner*—T. N. Quach
*Attorney, Agent, or Firm*—George O. Saile

[57] ABSTRACT

The method of forming an integrated circuit field effect transistor having a gate electrode, source and drain elements with buried contacts to a silicon substrate. A gate silicon oxide layer is formed on the silicon substrate. An in-situ doped layer of polysilicon is formed over the gate silicon oxide layer. An opening is formed in the doped polysilicon layer and the silicon oxide layer to the silicon substrate at the location of the buried contacts. A layer of undoped polysilicon is deposited over the doped polysilicon layer and in the opening to the silicon substrate. Doping by ion implantation of the undoped polysilicon layer is done to form a doped polysilicon gate electrode/buried contact layer. The polysilicon gate electrode/buried contact layer is patterning and etching to form the gate electrode of said transistor and buried contact layer. The source and drain regions are implanted using said polysilicon gate electrode pattern as a mask. The structure is heated to form the buried contact to at least one of the source and drain regions. Alternatively, a contact to an existing device region within the substrate may be contacted using a similar multiple layer polysilicon method.

13 Claims, 3 Drawing Sheets

FABRICATION OF TRANSISTOR CONTACTS

BACKGROUND OF THE INVENTION (1) Field of the Invention

The invention relates to the fabrication of integrated circuit devices, and more particularly, to a method of forming high quality contacts to device regions and to the formation of buried contacts in the fabrication of integrated circuits.

(2) Description of the Prior Art

High quality electrical contacts to transistor regions within a semiconductor substrate is a critical necessity for the submicron feature size era in the manufacture of integrated circuits. This is a particular problem wherein doped polycrystalline silicon (polysilicon) is used as the electrical contacting material. There are two possibilities of problem (1) the buried contact formation and contact therefor and (2) the electrical contact formation to an already formed region within the semiconductor substrate.

The first problem involves an implanted polysilicon gate that may result in imperfect device performance and in higher sheet resistance. Prior art processes for conventionally forming buried contacts use a doped polysilicon layer on a silicon substrate and the structure is heated to formed the diffused region in the silicon substrate. The doped polysilicon layer is allowed to remain upon the diffused layer to act as the contact to this diffused region. U.S. Pat. Nos. 4,830,972 and 5,030,584 describe such processes involving outdiffusion from doped polysilicon for forming buried contact diffused regions in a semiconductor substrate. U.S. Pat. No. 5,049,514 to Mori shows a process of doping polysilicon, open metal silicide layer, ion implanting, and annealing to form the source/drain region.

The problem with this method is to achieve the desired junction depth and doping concentration in the buried junction. The drawbacks of the prior art processes are insufficient doping concentration at the polysilicon diffused region interface and high polysilicon resistance. The polysilicon cannot be too heavily doped because this would result in too deep a buried contact junction.

The second problem involves the contact to an already formed transistor device region, such as an N+ source/drain region. The normal polysilicon electrical contact for such a region in composed of a layer of doped polysilicon and a layer of a metal silicide. During the formation of this contact structure, the polysilicon is normally deposited undoped, metal silicide formed and doping of the polysilicon by ion implantation thereafter. The structure is now heated after the ion implantation. During this heating/annealing there is a deterioration of the electrical conductivity of the contact.

SUMMARY OF THE INVENTION

A principal object of the present invention is to provide an effective and very manufacturable method of forming contact junctions.

Another object of the present invention is to provide a split polysilicon technique which provides assured and sufficient doping at the polysilicon/gate oxide interface.

Yet another object of the present invention is to provide a split polysilicon method that achieves excellent polysilicon sheet resistance.

Yet another object of the present invention is to provide a method of involving the use of a split polysilicon technique for forming buried contact junctions that are shallow and achieve good polysilicon sheet resistance.

In accordance with the objects of this invention the method of forming an integrated circuit field effect transistor having a gate electrode, source and drain elements with buried contacts to a silicon substrate. A gate silicon oxide layer is formed on the silicon substrate. An in-situ doped layer of polysilicon is formed over the gate silicon oxide layer. An opening is formed in the doped polysilicon layer and the silicon oxide layer to the silicon substrate at the location of the buried contacts. A layer of undoped polysilicon is deposited over the doped polysilicon layer and in the opening to the silicon substrate. Doping by ion implantation of the undoped polysilicon layer is done to form a doped polysilicon gate electrode/buried contact layer. The polysilicon gate electrode/buried contact layer is patterning and etching to form the gate electrode of said transistor and buried contact layer. The source and drain regions are implanted using said polysilicon gate electrode pattern as a mask. The structure is heated to form the buried contact to at least one of the source and drain regions.

Further in accordance with the invention, a method of forming an integrated circuit transistor contact to a device region in silicon substrate involves forming a device region in a silicon substrate through an opening in an insulating layer covering the substrate. Depositing an in-situ doped layer of polysilicon over the insulating layer and the device region. Depositing a layer of undoped polysilicon over the doped polysilicon layer. The undoped polysilicon layer is doped by ion implantation to form a doped polysilicon layer. Patterning and etching the polysilicon is done to form the desired extent of said contact to a device region. The structure is heated to form a uniformly doped contact to the device region of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
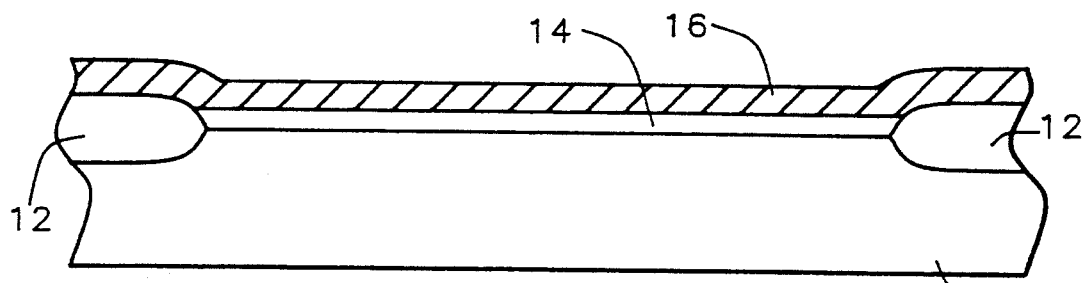
FIGS. 1, 2, 3, 4, 5, and 6 schematically illustrate in cross-sectional representation one preferred embodiment of this invention involving the buried contact.

Referring now more particularly to FIG. 1, there is shown an illustration of a portion of a partially completed integrated circuit in which there is a monocrystalline semiconductor substrate 10 in which there are formed field oxide regions 12. The surface of the silicon substrate 10 is thermally oxidized to form the desired gate oxide thickness 14. This layer is between about 50 to 200 Angstroms in thickness.

The polysilicon layer 16 is deposited by low temperature chemical vapor deposition (LPCVD) method and in-situ doped preferably with phosphorus at about 560° C. This layer has a preferred thickness of between about 500 to 800 Angstroms. The use of the in-situ doped polysilicon layer assures degenerate doping near the polysilicon/gate interface. Device integrity is assured because of the dopant concentration provided by the in-situ doping in this first polysilicon layer. A lower polysilicon sheet resistance also occurs because of the heavy phosphorus concentration in the layer. It is also possible to form the layer 16 as undoped polysilicon and subsequently dope the layer with arsenic or phosphorus.

Figure 2:
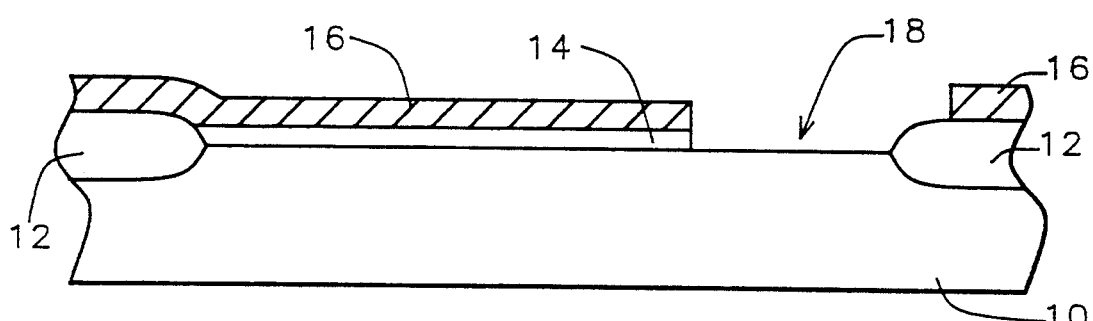

Conventional photolithographic methods are employed to define the buried contact. The polysilicon layer 16 and gate oxide layer 14 are etched by conventional plasma etching or reactive ion etching techniques to form an opening 18, shown in FIG. 2, to the substrate 10.

Figure 3:
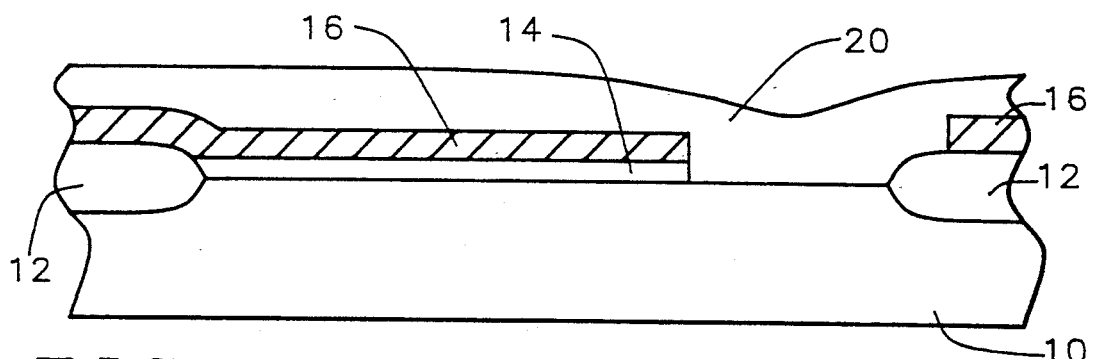

FIG. 3 shows the addition of the undoped deposition of the critical thickness layer of polysilicon 20. This layer is deposited to a thickness of between about 1500 to 3500 Angstroms. The polysilicon layer 20 is doped by, for example, ion implantation of phosphorus under the conditions between about 1 E 15 to 5 E 16 atoms/$cm^2$ and preferably about 4 E 15 to 1 E 16 atoms/$cm^2$ at energy levels of 30 to 80 KEV to give a concentration of about 5 E 19 to 5 E 20 Atoms/$cm^3$. Doping with Arsenic ion implantation is also an alternative and results in a shallower junction than that resulting from ion implantation of Phosphorus. Preferable Arsenic doping is 8 E 16 to 2 E 16 at 30 to 80 KEV to give similar concentrations to that given above for phosphorus. Higher implantation doses will give lower buried contact resistance, but produces a deeper junction which may not be desirable. The source/drain may be formed at a later time in the process. The desired depth of the ion implantation within the layer 20 is 0.20 to 0.35 micrometers.

Figure 4:
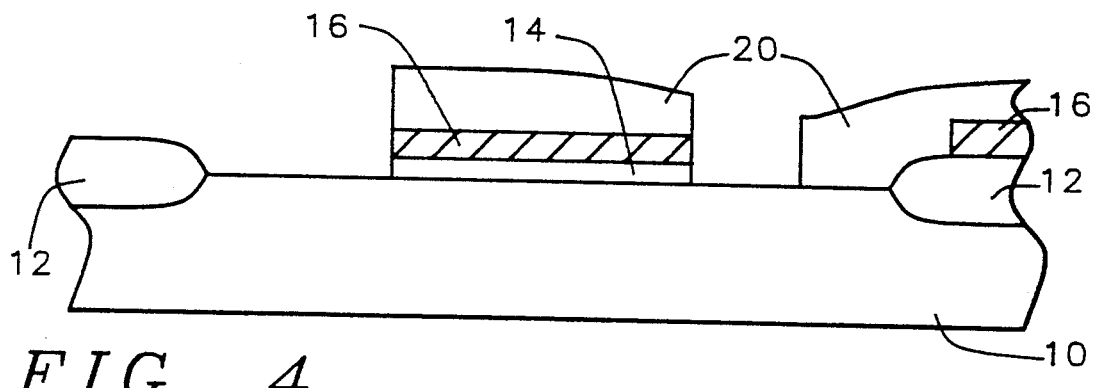

Again, conventional photolithography is employed to pattern the polysilicon layer 20 to form the gate electrode/buried contact portions of the transistor as illustrated in FIG. 4.

Figure 5:
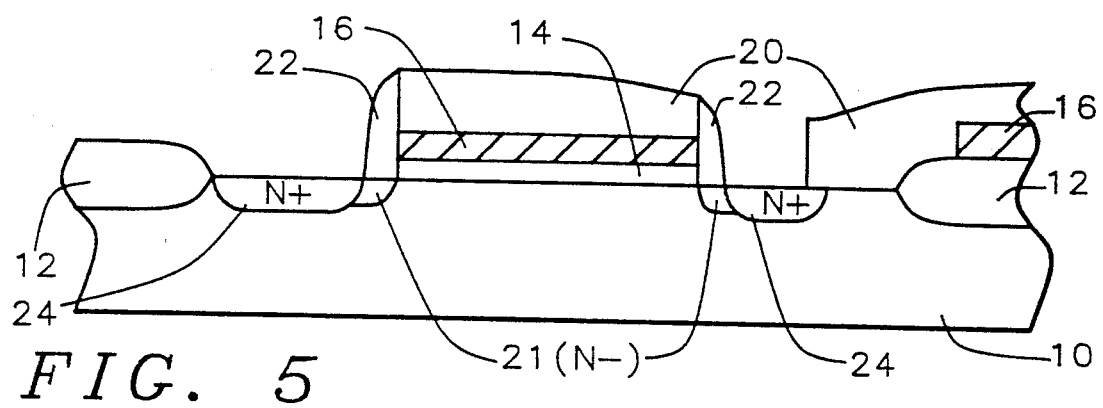

The source/drain structure of the NMOS FET may now be formed by the following steps. FIG. 5 illustrates the formation of a N channel FET integrated circuit device. However, it is well understood by those skilled in the art that a CMOS FET could be formed in a similar way by making both N and P channel devices upon the same substrate.

FIG. 5, for example shows the ion implantations of N-dopants. Lithographic masks may be required to protect the areas not to be subjected to that particular N-ion implantation. The formation of the lithographic masks are done by conventional lithography and etching techniques. The N-lightly doped drain implantation 21 is conventionally done using phosphorus at a low dosage. The dielectric spacer 22 is now to be formed followed by the completion of the lightly doped drain source/drain structures. A low temperature silicon oxide deposition is preferred such as through the chemical vapor deposition of tetraethoxysilane (TEOS) at a temperature in the range of between about 300° to 400° C. Other silicon oxide deposition methods include silane based LPCVD. The thickness of the dielectric silicon dioxide layer 21 is typically between about 1500 to 2500 Angstroms. An anisotropic etching of this layer produces the dielectric spacer layer 22 on the sidewalls of the layer structures 14, 16, 20. The anisotropic etching uses a conventional reactive ion etching ambient.

The N+ source/drain ion implantation of the invention uses a another conventional phosphorus ion implantation with or without a screen silicon oxide layer and lithographically formed resist block out mask to form the N+ source/drain regions 24 as seen in FIG. 5.

Figure 6:
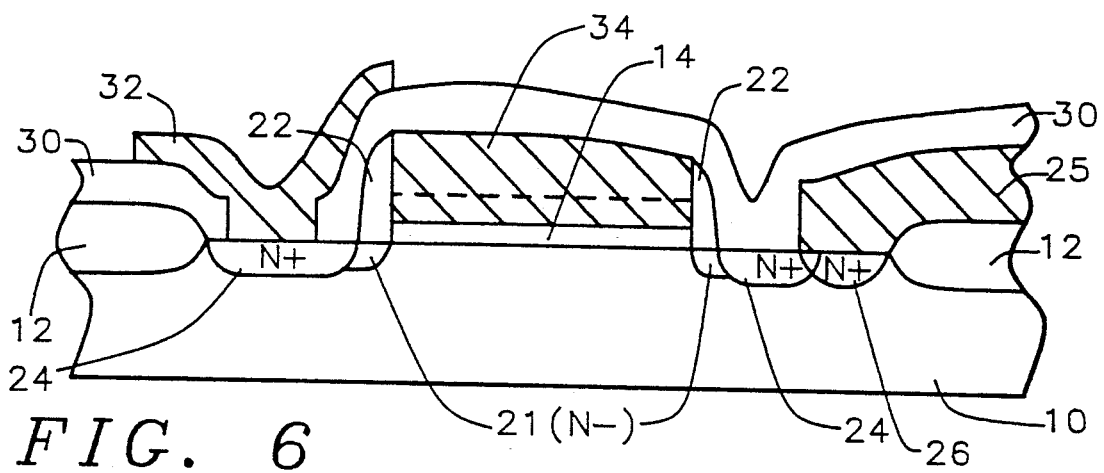

Referring now to FIG. 6, TEOS silicon oxide or other suitable silicon oxide layer 30 is deposited over the surfaces to act as the insulating layer for the next metallurgy layer.

The structure is heated to temperature of at least 850 and preferably less than 1000° C. to cause the critical even distribution of the dopant in layers 16 and 20, and to form the buried region 26 by outdiffusion from the buried contact layer 25 which is the result of the evenly distribution process. The gate electrode 34 is also formed from this heating process which makes the layers 16 and 20 in the dopants in the gate electrode region become evenly distributed.

Openings are made to contact the source/drain regions 24 that are not contacted by the buried contacts 25 which contact buried regions 26. The contact metallurgy to contact regions 24 may be deposited by sputtering, vacuum evaporation or similar techniques. The metallurgy fills the openings. Patterns of the metallurgy results in contacts 32 to the regions 24. The gate electrode 34 is contacted at this level by the metallurgy, but for simplicity sake is not shown in the cross section, because the contact is out of the drawing. Contact can also be made to layer 25 at this level, but this is not shown since it is also out of the drawing.

Figure 7:
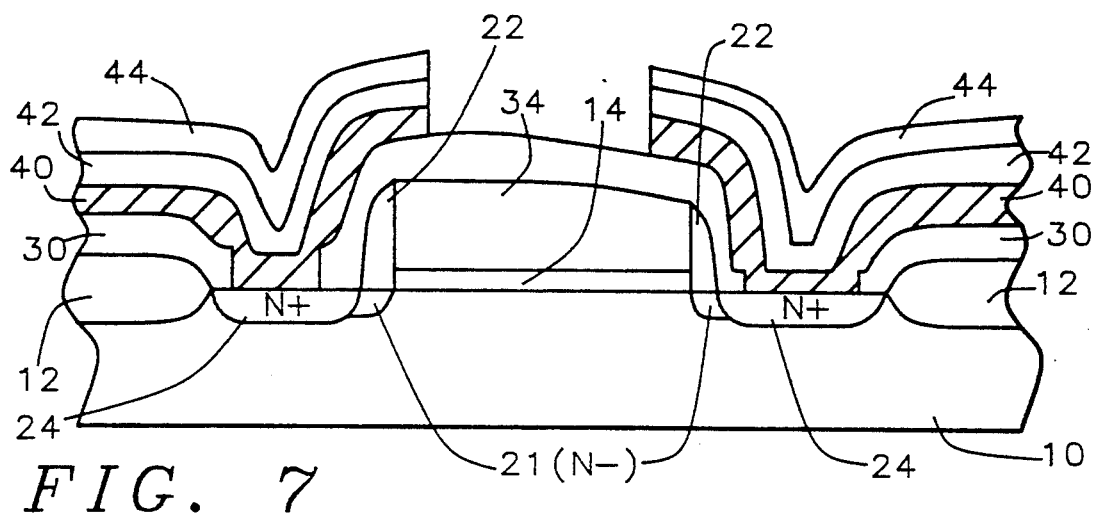
FIGS. 7 and 8 schematically illustrate in cross-sectional representation one preferred embodiment of this invention involving the electrical contact to an earlier formed device region.
Figure 8:
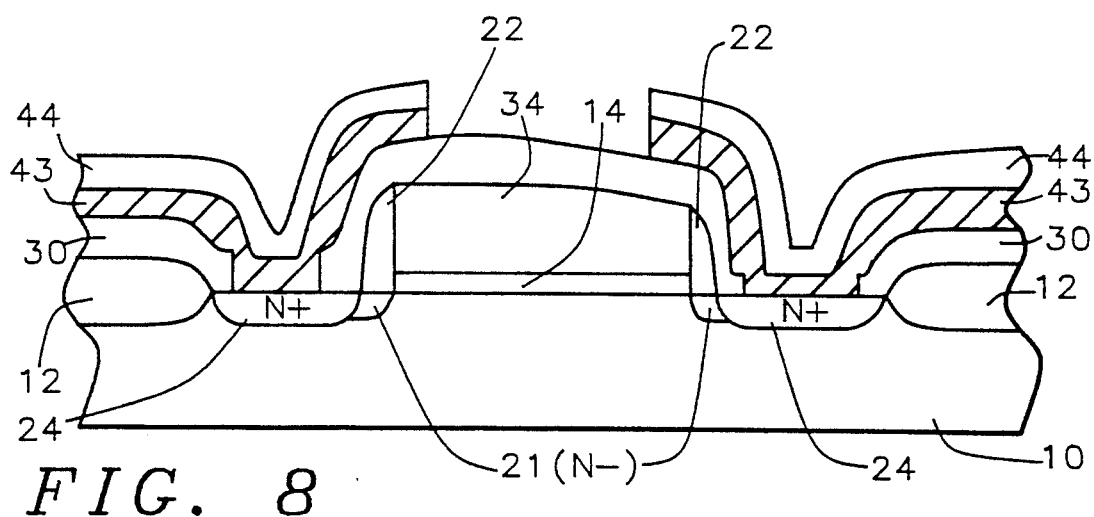

FIG. 7 and FIG. 8 show the alternative wherein electrical contacts are made to source/drain regions 24 using the novel methods of the present invention. The structures up to the formation of the electrical contacts to regions 24 are formed as described above with regard to the FIG. 1 through 6 embodiment of the invention, so these steps will not be described again. Like regions use like numbers in the FIG. 1 through 6 and FIG. 7 through 8 embodiment.

As seen in FIG. 7, the polysilicon layer 40 is deposited by low temperature chemical vapor deposition (LPCVD) method and in-situ doped preferably with phosphorus at about 560° C. This layer has a preferred thickness of between about 500 to 800 Angstroms. The addition of the undoped deposition of the critical thickness layer of polysilicon 42 is now done. This layer is deposited to a thickness of between about 1500 to 3500 Angstroms. The polysilicon layer 42 is doped by, for example, ion implantation of phosphorus under the conditions between about 1 E 15 to 5 E 16 atoms/$cm^2$ and preferably about 4 E 15 to 1 E 16 atoms/$cm^2$ at energy levels of 30 to 80 KEV to give a concentration of about 5 E 19 to 5 E 20 Atoms/$cm^3$. Doping with Arsenic ion implantation is also an alternative and results in a shallower junction than that resulting from ion implantation of Phosphorus. Preferable Arsenic doping is 8 E 16 to 2 E 16 at 30 to 80 KEV to give similar concentrations to that given above for phosphorus. Higher implantation doses will give lower buried contact resistance, but produces a deeper junction which may not be desirable. The desired depth of the ion implantation within the layer 42 is 0.20 to 0.35 micrometers.

Metal silicide is preferably, but not necessarily formed by conventional techniques over layer 42 to increase the conductivity of the electrical contact to N+ regions 24. Typically the layer is a refractory metal, such as tungsten or tantalum or the like. The thickness of the layer is between about 1500 to 3500 Angstroms.

The structure is heated to temperature of at least 850 and preferably less than 1000° C. to cause the critical even distribution of the dopant in layers 40 and 42 contact layer 43 which is the result of the evenly distribution process. Where, as is preferred the metal silicide layer 44 is present the effect of the metal silicide drawing conductivity imparting dopant from the polysilicon layer will not unduly cause a radical lowering of sheet resistance due to the present process. The result of this process is shown in FIG. 8.

While the invention has been particularly shown and described with reference to the preferred embodiments thereof, it will be understood by those skilled in the art that various changes in form and details may be made without departing from the spirit and scope of the invention.

What is claimed is:

1. The method of forming an integrated circuit field effect transistor having a gate electrode, source and drain elements with buried contacts to a silicon substrate comprising:
   forming a gate silicon oxide layer on said silicon substrate;
   depositing an in-situ doped layer of polysilicon over said gate silicon oxide layer;
   forming an opening in said doped polysilicon layer and said silicon oxide layer to said silicon substrate at the location of said buried contacts;
   depositing a layer of undoped polysilicon over the said doped polysilicon layer and in said opening to said silicon substrate;
   doping by ion implantation said undoped polysilicon layer to form a second doped polysilicon layer;
   patterning and etching said second doped polysilicon layer to form the said gate electrode of said transistor while leaving said doped polysilicon layer covered by said second doped polysilicon layer and extending over the said opening;
   ion implanting said source and drain regions using said polysilicon gate electrode pattern as a mask; and heating said substrate to form said buried contact to at least one of said source and drain regions.

2. The method of claim 1 wherein the thickness of said doped polysilicon layer is between about 500 and 800 Angstroms and it is in situ doped.

3. The method of claim 1 wherein the thickness of said second doped polysilicon layer is between about 1500 and 3500 Angstroms.

4. The method of claim 3 wherein said doping by ion implantation of said second doped polysilicon layer is done at doping concentration of between about 4 E 15 to 1 E 16 atoms/cm$^2$ and at an energy of between about 30 to 80 KEV.

5. The method of claim 1 wherein said heating step is performed at a suitable temperature to provide a buried region depth of between about 0.20 to 0.35 micrometers and having a surface concentration level of between about 5 E 19 to 5 E 20 atoms/cm$^3$.

6. The method of claim 1 wherein said source and drain regions are at a junction depth of between about 0.20 to 0.35 micrometers.

7. The method of forming a buried contact to a silicon substrate comprising:
   forming a silicon oxide layer on said silicon substrate;
   depositing a doped layer of polysilicon over said silicon oxide layer;
   forming an opening in said doped polysilicon layer and said silicon oxide layer to said silicon substrate at the location of said buried contact;
   depositing a layer of undoped polysilicon over the said doped polysilicon layer and in said opening to said silicon substrate;
   doping by ion implantation said undoped polysilicon layer to form a doped polysilicon buried contact layer;
   patterning and etching said polysilicon buried contact layer while leaving the buried contact layer covering said doped polysilicon layer and extending over said opening;
   ion implanting active device regions to be contacted by said buried contact in said silicon substrate; and
   heating said substrate to form said buried contact in said silicon substrate and to contact said active device regions.

8. The method of claim 7 wherein the thickness of said doped polysilicon layer is between about 500 and 800 Angstroms and it is in situ doped with phosphorus.

9. The method of claim 7 wherein the thickness of said polysilicon buried contact layer is between about 1500 and 3500 Angstroms.

10. The method of claim 9 wherein said doping by ion implantation of said buried contact is done at doping concentration of between about 4 E 15 to 1 E 16 atoms/cm$^2$ and at an energy of between about 30 to 80 KEV.

11. The method of claim 7 wherein said heating step is performed at a suitable temperature to provide a buried region depth of between about 0.20 to 0.35 micrometers and having a surface concentration level of between about 5 E 19 to 5 E 20 atoms/cm$^3$.

12. The method of claim 7 wherein said active device regions are at a junction depth of between about 0.20 to 0.35 micrometers.

13. The method of claim 7 wherein said active device includes source/drain regions of a field effect transistor.

* * * * *